(12) United States Patent
Qiu et al.

(10) Patent No.: US 7,317,280 B2
(45) Date of Patent: Jan. 8, 2008

(54) ORGANIC LIGHT-EMITTING DEVICES AND THEIR ENCAPSULATION METHOD AND APPLICATION OF THIS METHOD

(75) Inventors: Yong Qiu, Beijing (CN); Lian Duan, Beijing (CN); Yang Li, Beijing (CN); Liduo Wang, Beijing (CN)

(73) Assignee: Tsinghua University, Beijing (CN)

( * ) Notice: Subject to any disclaimer, the term of this patent is extended or adjusted under 35 U.S.C. 154(b) by 272 days.

(21) Appl. No.: 10/720,420

(22) Filed: Nov. 24, 2003

(65) Prior Publication Data
US 2004/0160178 A1    Aug. 19, 2004

(30) Foreign Application Priority Data
Nov. 25, 2002   (CN)   ................... 02 1 49122

(51) Int. Cl.
*H05B 33/04* (2006.01)
*H01L 51/50* (2006.01)
(52) U.S. Cl. ............... 313/512; 313/509; 313/504; 313/503
(58) Field of Classification Search ........... 313/512, 313/506, 509, 511
See application file for complete search history.

(56) References Cited

U.S. PATENT DOCUMENTS

| 4,842,893 A | 6/1989 | Yializis et al. |
| 4,954,371 A | 9/1990 | Yializis |
| 5,260,095 A | 11/1993 | Affinito |
| 6,146,225 A | 11/2000 | Sheats et al. |
| 6,268,695 B1 * | 7/2001 | Affinito ............... 313/512 |
| 6,570,325 B2 * | 5/2003 | Graff et al. ............ 313/506 |
| 6,849,877 B2 * | 2/2005 | Yamazaki et al. ........ 257/86 |

OTHER PUBLICATIONS

Burrows et al., "Ultra barrier flexible substrates for flat panel displays," *Displays*, vol. 22, 2000, pp. 65-69.

Tang et al., "Organic electroluminescent diodes," *Appl. Phys. Lett.*, vol. 12, Sep. 21, 1987, pp. 913-915.

* cited by examiner

*Primary Examiner*—Mariceli Santiago
(74) *Attorney, Agent, or Firm*—RatnerPrestia

(57) ABSTRACT

An organic light-emitting device comprising a transparent substrate, an anode layer, a cathode layer, organic functional layers sandwiched between the anode layer and the cathode layer, and an encapsulation layer fabricated on one side or both sides of the device, wherein the encapsulation layer includes a thin multilayer structure and a thick organic insulation layer. The thin multilayer structure has a period number (n) of alternating layers formed of a polymer material layer and a ceramic material layer. The thick organic insulation layer is made up of polymer materials on top of the thin multilayer.

6 Claims, 3 Drawing Sheets

The surface of PET substrates.

The surface of the UV curable resins with the thickness of 80nm on PET substrates.

The surface of the UV curable resins with the thickness of 150nm on PET substrates.

The surface of the UV curable resins with the thickness of 300nm on PET substrates.

ORGANIC LIGHT-EMITTING DEVICES AND THEIR ENCAPSULATION METHOD AND APPLICATION OF THIS METHOD

BACKGROUND OF THE INVENTION

1. Field of the Invention

The present invention relates to organic light-emitting devices. More particularly, the invention provides a kind of encapsulation method of the organic light-emitting devices and the application of this method.

2. Description of the Related Arts

Recently, with the development of multimedia technology and the coming of information society, the desire for high performance flat panel displays becomes more and more emphasized. Three recently developed kinds of display technology, i.e. plasma display, field emission display and organic light-emitting display, can make up for shortcomings of the CRT and LCD to a certain extent. Selected from these display technologies, organic light-emitting devices (OLEDs) show many advantages such as self-emission, low voltage operation, all-solid state construction, wide view angle and full color. The OLEDs also show a quick response speed of up to 1000 times that of an LCD display and its manufacturing cost is relatively low compared to an LCD display with same distinguishability. Thus, OLEDs show a great foreground in the display field.

In 1987, C. W. Tang et. al. of Kodak Company reported a light-emitting diode with a double-layer structure of organic thin films, which is prepared by vapor deposition. Efficient injection of holes and electrons is provided from an indium-tin-oxide anode and an alloyed Mg:Ag cathode. High external quantum efficiency (1% photon/electron), luminous efficiency (1.5 lm/W) and brightness (>1000 cd/m$^2$) were achievable at a drive voltage of 10 V. (C. W. Tang, Applied Physics Letters. 51, 913 (1987)) In 1990, Burroughes et al. of Cambridge University found that certain polymer materials showed excellent electroluminescent characteristics and fabricated the first polymer light-emitting diodes, thus extending the development of organic light-emitting diodes to the polymer field. In the past ten years, many efforts have been made to improve the device performance.

At present, OLEDs have not been commercialized in respect to mass production technology. The main difficulties in the mass production of OLEDs are: (1) the problem of OLEDs' lifetime; (2) the problems of production technology and quality control; (3) the problems of related technology (especially drive technology). The lifetime has been one of the hardest difficulties selected from all these problems. That is to say, the lifetime problem of OLEDs has thus far prevented the realization of their full potential to form the next-generation emissive displays and to achieve the commercial production. The lifetime of OLEDs is closely associated with the encapsulation effects because of the oxygen and moisture sensitivity of organic layers and cathodes in the devices. Many researchers have also demonstrated that moisture and oxygen are the main reasons to cause OLEDs' degradation. We may calculate how the oxidation of the low work function (Mg or Ca) cathode limits the operation lifetime of OLED devices by making a simple assumption. For example, assuming a Mg cathode has a thickness of 50 nm, a density of 1.74 g/cm$^2$ and a molar mass of 24 g, the OLED contains $3.6\times10^{-7}$ mol/cm$^2$ of metallic Mg. Such a cathode can be completely oxidized by about $6.4\times10^{-6}$ g of water. To achieve a device lifetime of a year, therefore, moisture permeability of an encapsulation layer has to be about $1.5\times10^{-4}$ g/m$^2$/day or less. Severe device degradation will likely be observed after 10% of the cathode is oxidized (indeed, if the damage occurs at the interface of organic layer and metal layer the metal layer loss of only 5 Å is possible to result in device failure). It is generally considered that the calculation ignores potential degradation of the organic semiconductor itself, which may be catalyzed by water and oxygen. It is clear that long life of OLEDs requires an encapsulation layer which transmits $<10^{-5}$ g/m$^2$/day of water. (Burrows P E, Graff G L, Gross M E, et al. Displays 22, 65 2001)

Nowadays, OLEDs have reached primary level of industrialization with both organic small molecule emission materials and polymer materials. One area of intensive research and development is flexible displays, which could be made by OLEDs as all-solid display devices with either small molecule or polymer. The displays of this kind, combined flexible transistor technology, could be applied to the products such as e-papers, wallpaper televisions, wearable monitors, etc. The main difference between flexible OLEDs and general ones is substrates which greatly affect the efficiency and operation lifetime of OLEDs. Compared with glass substrates, plastic substrates have the following drawbacks.

(1) The surface roughness of the plastic substrates is worse generally than that of glass substrates. OLEDs will be damaged by the spikes on the plastic surface which can yield pin holes in the functional thin layers.

(2) The plastic substrates have the shortcomings of comparatively high permeation rate of moisture and oxygen which cause the rapid degradation of OLEDs. The requirement in preventing devices from permeating moisture and oxygen is much more exigent than that of the anti-moisture packing film in foodstuff industry.

In order to overcome the shortcomings, much improvement has been made in the aspect of the surface roughness and the barrier properties to moisture and oxygen of the plastic substrates. A new technology called Polymer Multilayer (PML) is considered to be prospective to improve the plastic substrates' performance, which is mentioned in U.S. Pat. No. 4,842,893 (date of patent: Jun. 27, 1989), U.S. Pat. No. 4,954,371 (date of patent: Sep. 4, 1990) and U.S. Pat. No. 5,260,095 (date of patent: Nov. 9, 1993). PML includes a period number of alternating layers of polymer, which can planarize plastic substrates as a flexible buffer layer, and ceramic materials, which serve as a barrier layer, all of which are fabricated in vacuum ambience. The technology involves the flash evaporation of a liquid monomer in room temperature, e.g. acrylic monomer, onto a plastic substrate. Immediately after evaporation, the monomer is cured by irradiation of ultraviolet light, yielding a highly cross-linked and flat polymer film, e.g. polyacrylate. The ceramic barrier layers between polymer films are made up of silicon oxide, silicon nitride, silicon nitrogen oxide, aluminum oxide, aluminum nitride and aluminum nitrogen oxide, etc. which have an extraordinarily low permeation rate of moisture and oxygen and a very high optical transmission in visible spectrum. It has been demonstrated by many investigations that the surface of the plastic substrate is flat enough to fabricate high performance OLEDs, and that the moisture and oxygen permeability of a PML is approximately the same as glass. Because the PML structure is applied on the substrate, the cohesive connection between the plastic substrate and the transparent conductive film (such as Indium Tin Oxide, ITO) is improved, so that the OLEDs' performance is also improved.

The PML structure can also be applied to the encapsulation of OLEDs. The common encapsulation method applied to OLEDs with glass substrates is unsuitable for flexible OLEDs because cathode layers may be damaged by the glass encapsulation sheet for the bending of flexible OLEDs. The PML structure, the period number of alternating polymer and ceramic layers, has been adopted for the encapsulation of OLEDs, which mentioned in U.S. Pat. No. 6,146,225 (date of patent: Nov. 14, 2000). This structure is also inserted by a drier layer made up of active metals. The thin encapsulation layer is next to the cathode of OLEDs and greatly improves the operation lifetime of OLEDs. But the. encapsulation effects of the PML structure alone are not good enough for preventing moisture and oxygen permeation and for improving the mechanical performance such as the flexibility, the ability of preventing scratch and damage of the external force, as desired for commercially viable OLED devices. The thin encapsulation layer and the organic functional layers of OLEDs therefore can be easily degraded.

SUMMARY OF THE INVENTION

An object of the present invention is to provide organic light-emitting devices with high prevention of permeation of moisture and oxygen.

Another object of the present invention is to provide a method for encapsulating organic light-emitting devices, by which method the techniques of the encapsulation can be greatly simplified.

Another object of the present invention is to improve the performance of the plastic substrate by means of the encapsulation method of organic light-emitting devices in the invention. A flexible substrate has been fabricated which has an extraordinary low permeation rate of moisture and oxygen by this method.

These objects are achieved by an organic light-emitting device comprising a transparent substrate, an anode layer, a cathode layer, organic functional layers sandwiched between the anode and the cathode layers and an encapsulation layer fabricated on one side or both sides of the device, wherein the encapsulation layer includes a thin multilayer structure which has a period number (n) of alternating layers formed of a polymer material layer and a ceramic material layer, and a thick organic insulation layer, which is made up of polymer materials, on top of the thin multilayer.

Substrates of the OLEDs according to the present invention are made up of glass or plastic. One kind of materials selected from polyester, polyimide (PI), etc. such as polyethylene terephthalate (PET) is adopted for the substrates of flexible OLEDs. Onto the cathode of the devices only one encapsulation layer is needed when the OLEDs' substrates are glass.

The period number of the alternating thin layers in the present invention is desirably an integer of 1 to 10.

The flexibility of flexible OLEDs can also be improved by adding the thick organic insulation film onto the alternating thin layers in the encapsulation structure. When an object is bent (as shown in FIG. 2), a tensile stress exists on the top surface, while the compressing stress exists on the bottom. Thus, in the middle of the object there is one layer (i.e. $n_0$ layer, the neutral axis layer) which has no stress. The strain of any one layer (i.e. $n_1$ layer) in the object is given by:

$$\varepsilon = \frac{y}{R} \quad (1)$$

where y is the distance between $n_1$ and $n_0$ layers, R is $n_0$ layer's curvature radius.

The functional layers of a flexible OLED including ITO layer, organic layers and metal electrode layers whose total thickness is no more than hundreds of nanometers are all grown onto the plastic substrate whose thickness is hundreds of microns. Thus the functional layers of an unencapsulated OLED located on the surface of the substrate can be easily damaged by bending of the device because their distance y between $n_1$ and $n_0$ layers is large enough which can lead to the enough strain to destroy the device though R is still large. But when the location of functional layers is very close to the neutral axis layer in the middle of the whole device by adopting the encapsulation method of the present invention and by adjusting the thickness of thick organic insulation layer from tens of microns to thousands of microns, y has been reduced and the device will not be damaged until R is small enough. And when the functional layers are exactly at the neutral axis, folding flexible OLEDs may even be realized. Furthermore, the thick organic insulation layer can also prevent the devices from being scraped.

The exemplary organic light-emitting devices according to the present invention have the below described advantages.

A thick organic insulation layer added onto the alternating thin layers of the encapsulation layer of the OLEDs can improve the flexibility, barrier property for moisture and oxygen, mechanical performance and operation lifetime of the devices.

According to one aspect of the present invention, there is provided a method for encapsulating an organic light-emitting device comprising the following steps:

① depositing a thin liquid monomer layer on one side of the organic light-emitting device by means of vacuum evaporation, then allowing it to polymerize in situ and to form a flat solid polymer thin film by ultraviolet light irradiation;

② further depositing a ceramic thin film onto the polymer thin film;

③ subsequently fabricating n-1 periods of alternating thin layers formed of a layer of polymer and a layer of ceramic by repeating the above steps ① and ② n-1 additional times onto the ceramic thin film; and ④ finally, fabricating a thick liquid monomer layer by a doctor blade method on top of the period number n of alternating thin layers formed of polymer thin films and ceramic thin films, then allowing it to polymerize in situ and to form a flat thick organic insulation film by ultraviolet light irradiation.

The encapsulation method of the present invention may also comprise the steps: fabricating an encapsulation layer on the other side of the organic light-emitting device by repeating the above steps from ① to ④.

The encapsulation method of organic light-emitting devices according to the present invention has the below described advantages.

Due to the fact that the thick organic insulation layer is fabricated onto the period number n of alternating layers formed of polymer thin films and ceramic thin films, it has been demonstrated that a smaller period number of alternating layers can also achieve the aim of improving operation life and mechanical performance of the devices by adopting the thick organic insulation layer. Thus, the technique of this exemplary encapsulation method is greatly simplified over the prior art method.

According to another aspect of the present invention, there is provided a method for improving the performance of a plastic substrate by means of the above encapsulation method, comprising the below steps:
① depositing a thin liquid monomer layer on the plastic substrate by means of vacuum evaporation, then allowing it to polymerize in situ and to form a flat solid polymer thin film by ultraviolet light irradiation;
② further depositing a ceramic thin film onto the polymer thin film;
③ subsequently fabricating n-1 periods of alternating thin layers formed of a layer of polymer and a layer of ceramic by repeating the above steps ① and ② n-1 additional times onto the ceramic thin film; and
④ finally fabricating a thick liquid monomer layer by a doctor blade method on top of the period number n of alternating thin layers formed of polymer thin films and ceramic thin films, then allowing it to polymerize in situ and to form a flat thick organic insulation film by ultraviolet light irradiation.

Besides the performance improvement of plastic substrates, the application of the encapsulation method of organic light-emitting devices according to the present invention includes fabricating the flexible substrates with extraordinarily low permeation rate of moisture and oxygen. Such flexible substrates can be adopted for flexible OLEDs, flexible thin film transistors and other applications.

BRIEF DESCRIPTION OF THE DRAWINGS

The invention is better understood from the following detailed description when it is read with the accompanying drawings.

The present invention will be illustrated in greater detail by exemplary embodiments thereof in the light of the accompanying drawings and detailed description, but the invention is not construed as being limited thereto.

DETAILED DESCRIPTION OF THE INVENTION

For simplifying the descriptions herein, the names of some materials used in this invention are abbreviated. The abbreviation, whole name and corresponding molecular structure of many of the organic materials of present invention are shown in the below table 1.

TABLE 1

| Abbreviation | Whole name | Molecular structure |
|---|---|---|
| Alq$_3$ | tris(8-hydroxyquinoline) aluminum | |
| Al(Saph-q) | salicylidene-o-aminophenolato (8-quinolinoato) aluminum | |

TABLE 1-continued

| Abbreviation | Whole name | Molecular structure |
| --- | --- | --- |
| CuPc | phthalocyanine copper | |
| Gaq₃ | tris(8-hydroxyquinoline) gallium | |
| Ga(Saph-q) | salicylidene-o-ammophenolato (8-quinolinoato) gallium | |
| MTDATA | 4,4',4''-tris(3-methyl-phenylphenylamino) triphenylamine | |

TABLE 1-continued

| Abbreviation | Whole name | Molecular structure |
|---|---|---|
| NPB | N,N'-bis-(1-naphthyl)-N, N'-diphenyl-1,1'-biphenyl-4, 4'-diamine | |
| MEH-PPV | Poly(2-methoxy-5-ethylhexyloxy-1,4-phenylenevinylene)<br>R1 = methyl<br>R2 = 2-ethylhexyl | |
| TPD | N,N'-diphenyl-N,N'-bis(3-methylphenyl)-1,1'-biphenyl-4,4'-diamine | |

Figure 1:
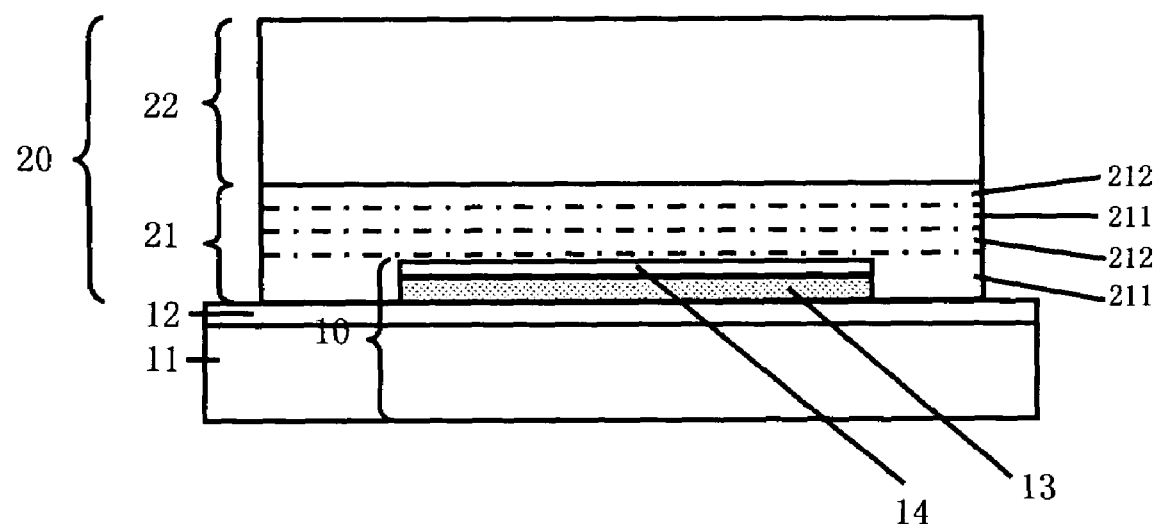
FIG. 1 is a schematic drawing of a structure of an organic light-emitting device according to the present invention. In this drawing element 10 is the organic light-emitting device, made up of elements 11, 12, 13, 14 together, without encapsulation layer. Elements 11, 12, 13, 14 are substrate, anode layer, organic functional layers and cathode layer, respectively. Element 20 is an encapsulation layer of the device which is made up of elements 21, 22 together. Element 21 is a period number n of alternating thin films formed of a layer of polymer materials (211) and a layer of ceramic materials (212). Element 22 is a thick organic insulation layer which is made up of polymer.
Figure 2:
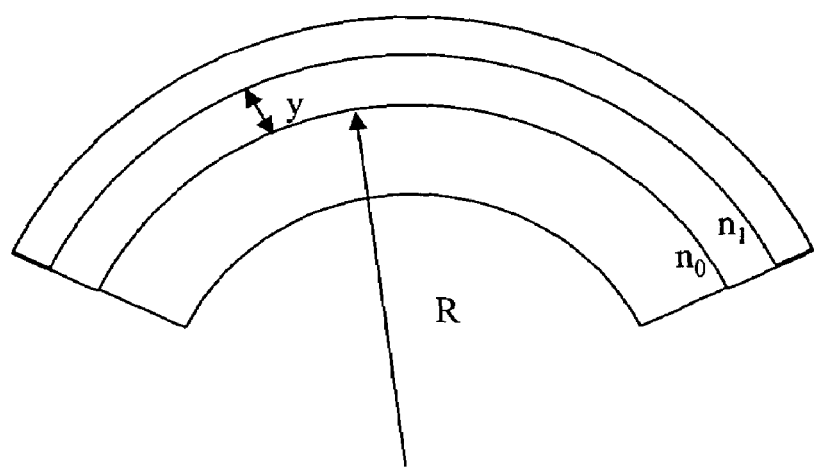
FIG. 2 is a schematic drawing of the strain in the films. In this drawing $n_0$ is the neutral axis layer having zero strain in the middle of the object, $n_1$ is an arbitrary layer in the object, y is the distance between $n_1$ and $n_0$ layers and R is the curvature radius of $n_0$ layer.

FIG. 1 is a schematic graph of the structure of the organic light-emitting device according to the present invention.

Element 10 is the organic light-emitting device without encapsulation layer, which includes elements 11, 12, 13 and 14 together. Element 11 is the substrate which can be fabricated using glass or using flexible polymer including polyester, polyimide (PI), etc. Element 12 is the anode layer formed of inorganic materials such as metal-oxide materials including indium tin oxide (ITO), zinc oxide and zinc tin oxide or the metals with relatively high work function including gold, copper, silver, etc. Among these anode layer materials the ITO layer is preferable. The anode layer can also be fabricated by organic conductive polymers including poly(3,4-ethylenedioxythiophene): poly(4-styrenesulfonate) (PEDOT:PSS), polyaniline (PANI), etc. Element 13 is the organic functional layer which can be formed of a single layer or multi-layers. Small molecule organic light-emitting materials, including metal chelates (such as Alq$_3$, Gaq$_3$, Al(Saph-q) and Ga(Saph-q)), and organic conjugated polymers, including the derivatives of polyvinylene, polythiophene, polycarbazole (such as poly(2-methoxy-5-ethylhexyloxy-1,4-phenylenevinylene), MEH-PPV), may be used for the single layer structure. In the multi-layers structure, there is an emitting layer formed of organic light-emitting materials, a hole transport layer formed of triphenylamines such as NPB, TPD, MTDATA, etc., an electron transport layer formed of metal chelates such as Alq$_3$, and an anode buffer layer or cathode buffer layer made up of a buffer material such as phthalocyanine, polyacrylic ester, polyimide, fluorine-contained polymer, inorganic fluoride, inorganic oxide and diamond. Element 14 is the cathode layer desirably formed of low work function metals including lithium, magnesium, calcium, strontium, aluminum, indium or the alloys between them and copper, gold, and silver. It is most preferable that the cathodes consist of the alloy of Mg:Ag/Ag and of LiF/Al.

Element 20 is the encapsulation layer (FIG. 1) of the organic light-emitting device according to the present invention comprising layers 21 and 22 together. Layer 21 includes a period number n of alternating thin films formed of a layer of polymer materials (211) and a layer of ceramic materials (212). Material such as poly(methyl methacrylate) (PMMA), poly(ethyl methacrylate) (PEMA) and ultraviolet curable resins may be selected for the polymer thin layers (211), which are desirably in the range of about 50 to 1000 nm in thickness. The ceramic thin layers (212) may be formed of a material such as silicon nitride, aluminum nitride, titanium nitride, silicon oxide, aluminum oxide, titanium oxide, silicon nitrogen oxide, aluminum nitrogen oxide, titanium nitrogen oxide, etc. that has an extraordinarily low permeation rate for moisture and oxygen. The ceramic thin layer (212) is desirably in the range of about 10 to 1000 nm in thickness. The thick organic insulation layer (22), which is desirably in the range of about 10 to 1000 μm in thickness, may be formed of materials such as ultraviolet curable resins and the anti-moisture organic insulation coatings.

An exemplary encapsulation method of the present invention is described below in detail in combination with the drawings.

① A thin liquid monomer layer is prepared by vacuum thermal deposition under $10^{-4}$-$10^{-3}$ Pa on the back side of the OLEDs. Through ultraviolet light irradiation, this liquid monomer layer polymerizes in situ to form a highly cross-linked flat polymer thin film, which is desirably in the range of about 50 to 1000 nm in thickness. The irradiation time length is dependent on the kind of the UV curable materials and is generally about 1 to 10 minutes.

② A ceramic thin layer is formed on the polymer thin layer by using a direct current (DC) or radio frequency (RF) sputtering system. Reactive sputtering takes place from a highly pure target of titanium, aluminum or silicon in plasma containing nitrogen or oxygen or the mixture thereof in a predetermined ratio. The background pressure is desirably $10^{-4}$-$10^{-3}$ Pa before the gas is infused into the vacuum chamber. The pressure is desirably maintained at 0.1-10 Pa by gas inlet via a needle valve, and the sputtering direct current power is kept at 0.5-50 W/cm$^2$. The devices may be placed on a water-cooled platform so that their temperatures are kept below 40° C. The sputtering time is in the range of about 10 seconds to 60 minutes and the ceramic film thickness is 10 to 1000 nm.

③ An additional n-1 periods of alternating thin layers formed of a layer of polymer and a layer of ceramic are subsequently fabricated by repeating the above steps ① and ② n-1 times.

④ Finally, a thick liquid monomer layer is fabricated by a doctor blade method on top of the period number n of alternating thin layers formed of polymer thin films and ceramic thin films. This thick liquid monomer layer may be polymerized in situ by ultraviolet light irradiation to form a flat organic insulated thick film, which is in the range of about 10 to 1000 μm in thickness. The irradiation time is desirably about 1 to 10 minutes.

Another exemplary encapsulation method of the present invention is described below in detail in combination with the drawings.

① A thin liquid monomer layer is prepared by vacuum thermal deposition under $10^{-4}$-$10^{-3}$ Pa on the back side of the OLEDs: Through ultraviolet light irradiation, this liquid monomer layer polymerizes in situ to form a highly cross-linked flat polymer thin film, which is desirably in the range of about 50 to 1000 nm in thickness. The irradiation time length is dependent on the kind of the UV curable materials and is generally about 1 to 10 minutes.

② A ceramic thin layer is formed on the polymer thin layer by using a plasma-enhanced chemical vapor deposition (PECVD) method. Reactive deposition takes place in the ambience of reaction gases (such as silane and ammonia when the silicon nitride is deposited) in a predetermined ratio. The background pressure is desirably $10^{-4}$-$10^{-3}$ Pa before the gas is infused into the vacuum chamber. The pressure is desirably maintained at 5-50 Pa by gas inlet via a needle valve, and the reaction power is kept at 10-500 W The devices may be placed on a water-cooled platform so that their temperatures are kept below 50° C. The reaction time is in the range of about 10 seconds to 30 minutes and the ceramic film thickness is 10 to 1000 nm.

③ An additional n-1 periods of alternating thin layers formed of a layer of polymer and a layer of ceramic are subsequently fabricated by repeating the above steps ① and ② n-1 times.

④ Finally, a thick liquid monomer layer is fabricated by a doctor blade method on top of the period number n of alternating thin layers formed of polymer material thin films and ceramic material thin films. This thick liquid monomer layer may be polymerized in situ by ultraviolet light irradiation to form a flat organic insulated thick film, which is in the range of about 10 to 1000 μm in thickness. The irradiation time is desirably about 1 to 10 minutes.

The steps shown in the two exemplary encapsulation methods above may be used for encapsulating plastic substrates, as well. Exemplary plastic substrates whose performance is improved by the encapsulation method according to the present invention can be suitably applied in the fabrication of flexible substrates which have an extraordinarily low permeation rate of moisture and oxygen.

EXAMPLE 1

All layers of an OLED were fabricated by vacuum thermal evaporation at $5 \times 10^{-4}$ Pa on an ultrasonic and ultraviolet ozone cleaned glass substrate coated with an ITO film of 150 nm in thickness and of 15 Ω/square in sheet resistance. The ultrasonic cleaning was carried out in deionized water containing lotion at 60° C. The ITO-coated glass substrate was dried by an infrared lamp. Organic layers including CuPc (an anode buffer layer) about 20 nm in thickness, an NPB layer (a hole transport layer) about 50 nm in thickness, and an Alq$_3$ layer (an emitting and electron transport layer) about 50 nm in thickness were deposited onto the ITO layer. Following the deposition of the organic layers, 200-nm-thick cathodes were fabricated by co-evaporation of 100-nm-thick Mg and Ag (deposited at the rate of 1.0 and 0.1 nm/s, respectively) and by the evaporation of 100-nm-thick Ag, without breaking the vacuum. Then the OLED was taken out of the vacuum chamber.

A thin liquid UV curable resin (for example, UV STRCTL 352 of Le Tai corporation) layer was fabricated by vacuum thermal evaporation at $5 \times 10^{-4}$ Pa on the back of the OLED in another vacuum chamber used for encapsulation. This layer was polymerized in situ by an ultraviolet light irradiation of 5 minutes to form a highly cross-linked flat solid polymer thin film which was about 300 nm in thickness. A ceramic thin layer was formed on the polymerized UV curable resins layer, using a DC sputtering system. Reactive sputtering took place from a highly pure target of titanium in a plasma containing nitrogen. The background pressure was $10^{-4}$-$10^{-3}$ Pa before the gas was infused into the vacuum chamber. The pressure was maintained at 0.40 Pa by gas inlet via a needle valve, and the sputtering direct current power was kept at 96 W. The device was placed on a water-cooled platform so that its temperature was kept below 40° C. The sputtering time was 10 minutes and the TiN film thickness was 50 nm. Another period of UV curable resins/TiN multi-layers was subsequently fabricated on this TiN thin film by repeating the above thin film deposition steps. Finally, a thick film of liquid UV curable resins, which was about 70 μm in thickness, was fabricated by doctor blade method. This thick film of liquid UV curable resins was polymerized in situ by an ultraviolet light irradiation of 5 minutes in a glove box being full of highly pure nitrogen gas to form a highly cross-linked organic insulated thick film.

EXAMPLE 2

All layers of an OLED were fabricated by vacuum thermal evaporation at $5 \times 10^{-4}$ Pa on an ultrasonic and ultraviolet ozone cleaned glass substrate coated with an ITO film of 150 nm in thickness and of 15 Ω/square in sheet resistance. The ultrasonically cleaning was carried out in deionized water containing lotion at 60° C. The ITO-coated glass substrate was dried by an infrared lamp. Organic layers including CuPc (an anode buffer layer) about 20 nm in thickness, an NPB layer (a hole transport layer) about 50 nm in thickness, and an $Alq_3$ layer (an emitting and electron transport layer) about 50 nm in thickness were deposited onto the ITO layer. Following the deposition of the organic layers, 200-nm-thick cathodes were fabricated by co-evaporation of 100-nm-thick Mg and Ag (deposited at 1.0 and 0.1 nm/s, respectively) and by the evaporation of 100-nm-thick Ag, without breaking the vacuum. Then the OLED was taken out of the vacuum chamber.

A thin liquid UV curable resin (for example, UV STRCTL 352 of Le Tai corporation) layer was fabricated by vacuum thermal evaporation at $4 \times 10^{-4}$ Pa on the back of the OLED in another vacuum chamber used for encapsulation. This layer was polymerized in situ by an ultraviolet light irradiation of 5 minutes to form a highly cross-linked flat solid polymer thin film which was about 300 nm in thickness. A ceramic thin layer was formed on the polymerized UV curable resins layer, using DC sputtering system. Reactive sputtering took place from a highly pure target of aluminum in a plasma containing oxygen. The background pressure was $10^{-4}$-$10^{-3}$ Pa before the gas was infused into the vacuum chamber. The pressure was maintained at 0.40 Pa by gas inlet via a needle valve, and the sputtering direct current power was kept at 96 W. The device was placed on a water-cooled platform so that its temperature was kept below 40° C. The sputtering time was 10 minutes and the $Al_2O_3$ film thickness was 50 nm. Another two periods of UV curable resins/$Al_2O_3$ multi-layers were subsequently fabricated onto this $Al_2O_3$ thin film by repeating the above thin film deposition steps. Finally, a thick film of liquid UV curable resins, which was about 70 μm in thickness, was fabricated by doctor blade method. This thick film of liquid UV curable resins was polymerized in situ by an ultraviolet light irradiation of 5 minutes in a glove box being full of highly pure nitrogen gas to form a highly cross-linked organic insulated thick film.

Example 1 to 2 provide exemplary means by which, compared with the conventional encapsulation method by means of glass sealing cover, the weight and thickness of the whole OLEDs can be reduced.

EXAMPLE 3

Considering the fact that the encapsulation barriers exhibit moisture and oxygen barrier performance below the detection limit of typical instruments ($10^{-2}$ g/m²/day), the oxidation of calcium, a very active and sensitive metal to moisture and oxygen, was thus adopted for examining the encapsulation effects and the relationship between the period number n of alternating multi-layers and the encapsulation performance.

The encapsulation layers were deposited on the glass substrates in the order of Ca/(UV curable resins (100 nm)/TiN (80 nm))$_n$/UV curable resins (100 μm). The time of complete oxidation of calcium was observed at the temperature of 50° C. and the humidity of 95% and the results were list below in Table 2.

TABLE 2

| n | The time of complete oxidation of calcium (h) |
| --- | --- |
| 0 | <0.1 |
| 1 | 8.5 |

TABLE 2-continued

| n | The time of complete oxidation of calcium (h) |
| --- | --- |
| 2 | 108.5 |
| 3 | 298.3 |
| 4 | 488.9 |
| 5 | 663.3 |
| 6 | 629 |
| 7 | 710.4 |
| 8 | 760.3 |
| 9 | 766.2 |
| 10 | 744.7 |

It can be concluded that the optimum number of period was 5 because when the period number was more than 5, the lifetime had a little improvement, but the deposition techniques continue to become more complex with increasing period numbers.

Figure 3A:
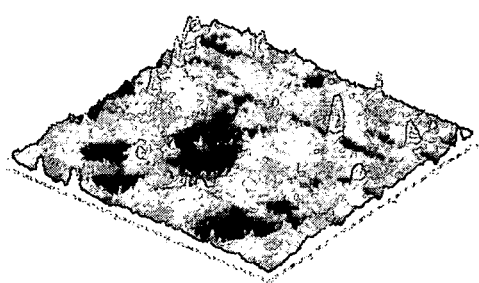
FIGS. 3A, 3B, 3C, and 3D are Atomic Force Microscopy (AFM) images for the different thickness of solidified ultraviolet curable resins fabricated onto the PET substrates in Example 4 of the present invention.
Figure 3B:
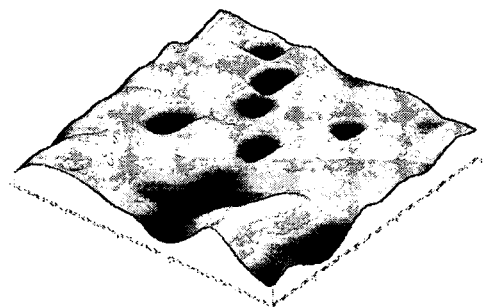
Figure 3C:
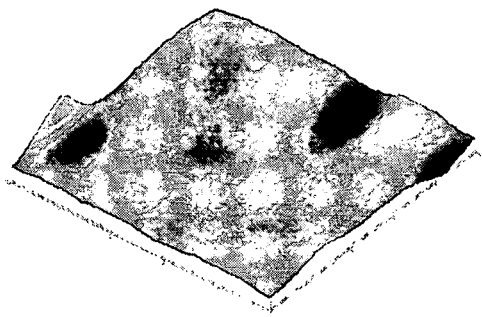
Figure 3D:
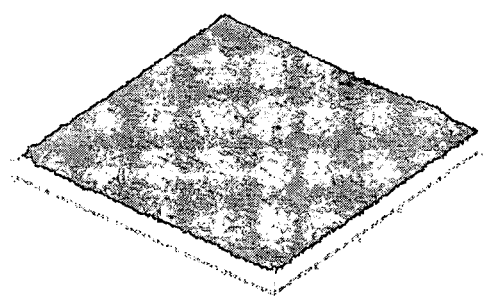

EXAMPLE 4 in FIG. 3A and AFM image of a commercially available PET substrate is shown. In FIGS. 3B, 3C, and 3D AFM images of PET substrates, which are identical to that in FIG. 3A, with the exception that 80 nm, 150 nm and 300-nm-thick layers of liquid monomer of UV curable resins were deposited respectively thereon and then polymerized by the ultraviolet light irradiation. It may be seen that a lot of spikes were on the surface of the bare PET, which could increase the surface roughness of a ceramic layer formed on this surface. The UV curable resins in a thickness of 80 nm had some improvement of flatness compared to the bare PET. But a lot of pin holes existed in depth of about 7 nm could also increase the surface roughness of a ceramic layer formed on this surface and provide channels of moisture and oxygen permeation. When the thickness of UV curable resins enhanced to 150 nm, it was observed that the number of pin holes greatly reduced and the pin holes was only about 2 nm in depth and the surface was rather flat. When the thickness enhanced to 300 nm, the surface was extraordinarily flat. The thickness of 150 nm was adopted for improving the performance of PET substrates in the following examples considering the rate and time of thermal evaporation.

A thin liquid UV curable resins (for example, UV STRCTL 352 of Le Tai corporation) layer was fabricated by vacuum thermal evaporation at $4 \times 10^{-4}$ Pa on the PET substrate. The layer was polymerized in situ by an ultraviolet light irradiation of 5 minutes to form a highly cross-linked flat solid polymer thin film which was about 150 nm in thickness. A ceramic thin layer was formed on the polymerized UV curable resins layer using a PECVD system. Reactive deposition took place in the ambience containing silane and ammonia (the ratio of the two gases in this example is 1:1). The background pressure was $1 \times 10^{-3}$ Pa before the gas was infused into the vacuum chamber. The pressure was maintained at 10 Pa by gas inlet via a needle valve, and the reaction power was kept at 100 W. The reaction chamber's temperature was kept below 50° C. The deposition time was 2 minutes and the $Si_3N_4$ film thickness was 100 nm. Another two periods of UV curable resins/$Si_3N_4$ multi-layers were subsequently fabricated on this $Si_3N_4$ thin film by repeating the above thin film formation steps. Finally, a thick film of liquid UV curable resins, which was about 70 μm in thickness, was fabricated by doctor blade method. The thick film of liquid UV curable resins was polymerized in situ by an ultraviolet light irradiation of 5 minutes in a glove box being full of highly pure nitrogen gas to form a highly cross-linked organic insulated thick film.

EXAMPLE 5

An ITO layer was prepared by using a DC sputtering system on an exemplary performance-improved PET substrate of example 4 (substrate 1). Reactive sputtering took place from a target of indium tin oxide in plasma containing argon and oxygen in the ratio of 100:1. The background pressure was $3\times10^{-4}$ Pa before the gas was infused into the vacuum chamber. The pressure was maintained at 0.50 Pa by gas inlet via a needle valve, and the sputtering direct current power was kept at 60 W. The substrate 1 was placed on a water-cooled platform so that its temperature was kept below 40° C. The sputtering time was 10 minutes, producing a transparent ITO film with a thickness of 100 nm and a sheet resistance of 100 Ω/square.

All layers of a flexible OLED were fabricated by vacuum thermal evaporation at $3\times10^{-4}$ Pa on substrate 1 coated with ITO deposited by the above steps. Organic layers including CuPc (an anode buffer layer) about 15 nm in thickness, an NPB layer (a hole transport layer) about 50 nm in thickness, and an $Alq_3$ layer (an emitting and electron transport layer) about 50 nm in thickness were deposited onto the ITO layer. Following the deposition of the organic layers, 200-nm-thick cathodes were fabricated by co-evaporation of 100-nm-thick Mg and Ag (deposited at 1.0 and 0.1 nm/s, respectively) and by the evaporation of 100-nm-thick Ag, without breaking the vacuum. Then the flexible OLED was taken out of the vacuum chamber.

A thin liquid UV curable resins (for example, UV STRCTL 352 of Le Tai corporation) layer was fabricated by vacuum thermal evaporation at $5\times10^{-4}$ Pa on the back of the flexible OLED in another vacuum chamber used for encapsulation. This layer was polymerized in situ by an ultraviolet light irradiation of 5 minutes to form a highly cross-linked flat solid polymer thin film which was about 300 nm in thickness. A ceramic thin layer was formed on the polymerized UV curable resins layer by using DC sputtering system. Reactive sputtering took place from a highly pure target of aluminum in a plasma containing oxygen and nitrogen in the ratio of 1:2. The background pressure was $10^{-4}$-$10^{-3}$ Pa before the gas was infused into the vacuum chamber. The pressure was maintained at 0.50 Pa by gas inlet via a needle valve, and the sputtering direct current power was kept at 100 W. The device was placed on a water-cooled platform so that its temperature was kept below 40° C. The sputtering time was 10 minutes and the aluminum nitrogen oxide film thickness was 50 nm. Another period of UV curable resins/aluminum nitrogen oxide multi-layers was subsequently fabricated by repeating the above thin film formation steps onto the aluminum nitrogen oxide thin film. A thick film of liquid UV curable resins, which was about 70 μm in thickness, was fabricated by doctor blade method. This thick film of liquid UV curable resins was polymerized in situ by an ultraviolet light irradiation of 5 minutes in a glove box being full of highly pure nitrogen gas to form a highly cross-linked organic insulated thick film.

Figure 4:
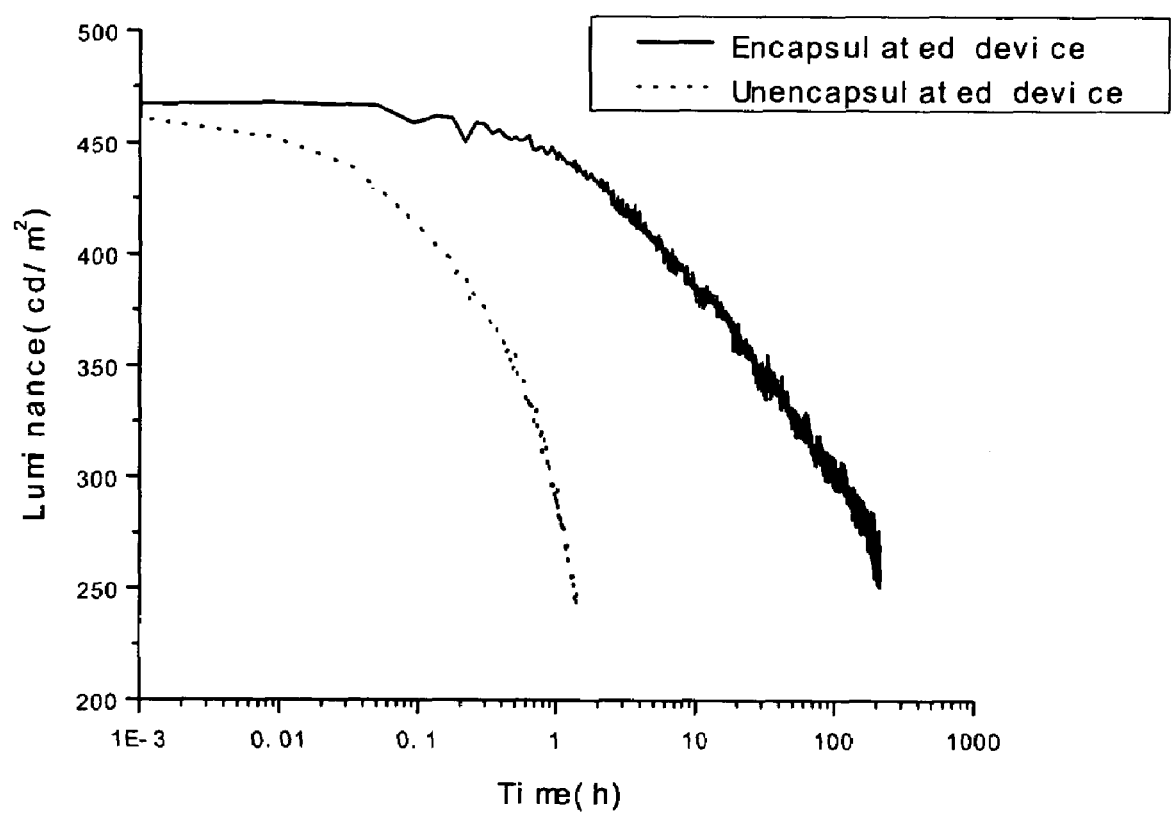
FIG. 4 is a schematic graph of the luminance decay curves, namely luminance versus time relationship, of the unencapsulated organic light-emitting device and the encapsulated one according to Example 5 of the present invention when lighting continuously.

Another unencapsulated OLED was fabricated on a new substrate 1 according to the same steps described above. FIG. 4 is a schematic graph of the luminance decay curves, i.e. the luminance versus time relationship, of two obtained exemplary OLEDs fabricated according to the present invention, when operated continuously under 20 mA/cm² in current density.

While this invention has been described in terms of some exemplary embodiments, it should also be understood that there are alterations, permutations, and equivalents which fall within the scope of the present invention as recited in the claims below.

What is claimed:

1. An organic light-emitting device comprising:
   a transparent substrate;
   an anode layer;
   a cathode layer;
   organic functional layers sandwiched between the anode layer and the cathode layer; and
   an encapsulation layer formed directly on at least one of the anode layer, the cathode layer, or the transparent substrate;
   wherein,
   the encapsulation layer includes a thin multilayer structure which has a period number of 1 to 10 alternating layers formed of a polymer material layer and a ceramic material layer;
   the encapsulation layer also includes a thick organic insulation layer on top of the thin multilayer structure, which is made up of polymer materials;
   wherein:
      the polymer material layers in the thin film structure are in the range of 50 to 1000 nm in thickness;
      the ceramic material layers in the thin film structure are in the range of 10 to 1000 nm in thickness; and
      the thick organic insulation layer in the encapsulation layer is in the range of 10 to 1000 μm in thickness.

2. The organic light-emitting device of claim 1, wherein the substrate of the device includes one of glass and plastic.

3. The organic light-emitting device of claim 1, wherein the polymer material layers in the thin film structure Include one polymer selected from the group consisting of poly (methyl methacrylate), poly(ethyl methacrylate), and UV curable resins.

4. The organic light-emitting device of claim 1, wherein the ceramic material layers in the thin film structure include one material selected from the group consisting of nitrides, oxides, and nitrogen oxides.

5. The organic light-emitting device of claim 4, wherein the ceramic material layers in the thin film structure include one material selected from the group consisting of silicon nitride, aluminum nitride, titanium nitride, silicon oxide, aluminum oxide, titanium oxide, silicon nitrogen oxide, aluminum nitrogen oxide and titanium nitrogen oxide.

6. The organic light-emitting device of claim 1, wherein the thick organic insulation layer in the encapsulation layer includes UV curable resins.

* * * * *